United States Patent
Sato et al.

(10) Patent No.: US 9,842,853 B2
(45) Date of Patent: Dec. 12, 2017

(54) MEMORY CELL ARRAY WITH IMPROVED SUBSTRATE CURRENT PATHWAY

(71) Applicant: Toshiba Memory Corporation, Minato-ku (JP)

(72) Inventors: Mitsuru Sato, Yatomi (JP); Shigeki Kobayashi, Kuwana (JP); Tsutomu Murase, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/971,310

(22) Filed: Dec. 16, 2015

(65) Prior Publication Data

US 2017/0077121 A1   Mar. 16, 2017

Related U.S. Application Data

(60) Provisional application No. 62/218,284, filed on Sep. 14, 2015.

(51) Int. Cl.
*H01L 27/11582* (2017.01)
*H01L 21/225* (2006.01)

(52) U.S. Cl.
CPC .... *H01L 27/11582* (2013.01); *H01L 21/2256* (2013.01)

(58) Field of Classification Search
CPC .......... H01L 27/11565; H01L 27/1157; H01L 27/11582; H01L 29/7926
See application file for complete search history.

(56) References Cited

U.S. PATENT DOCUMENTS

| 8,173,533 B2 * | 5/2012 | Kim ................. H01L 27/11582 257/347 |
| 8,278,695 B2 | 10/2012 | Kidoh et al. |
| 8,372,720 B2 | 2/2013 | Fukuzumi et al. |
| 2010/0155810 A1 * | 6/2010 | Kim ................. H01L 27/11548 257/316 |

(Continued)

FOREIGN PATENT DOCUMENTS

| JP | 2008-72051 | 3/2008 |
| JP | 2009-146954 | 7/2009 |

(Continued)

*Primary Examiner* — Allen Parker
*Assistant Examiner* — Ismail Muse
(74) *Attorney, Agent, or Firm* — Oblon, McClelland, Maier & Neustadt, L.L.P.

(57) ABSTRACT

A semiconductor memory device according to an embodiment includes a first semiconductor layer containing an acceptor and a memory cell array including an interlayer insulating layer and a conductive layer arranged in a first direction above the first semiconductor layer and a memory columnar body extending in the first direction and having a lower end positioned lower than a position of a top surface of the first semiconductor layer, the memory columnar body containing a second semiconductor layer in a columnar shape having a side face opposite to a side face of the conductive layer, wherein a first portion of the first semiconductor layer in contact with the side face of the memory columnar body contains a donor in a higher concentration than a second portion different from the first portion of the first semiconductor substrate.

20 Claims, 16 Drawing Sheets

(56) References Cited

U.S. PATENT DOCUMENTS

| | | | |
|---|---|---|---|
| 2010/0320528 A1* | 12/2010 | Jeong | H01L 27/105 |
| | | | 257/324 |
| 2011/0193049 A1* | 8/2011 | Iwakaji | H01L 27/1021 |
| | | | 257/4 |
| 2012/0068242 A1* | 3/2012 | Shin | H01L 27/11582 |
| | | | 257/315 |
| 2012/0068255 A1* | 3/2012 | Lee | H01L 27/11582 |
| | | | 257/324 |
| 2012/0307568 A1* | 12/2012 | Banna | H01L 27/11565 |
| | | | 365/185.28 |
| 2013/0334593 A1 | 12/2013 | Seol et al. | |
| 2014/0070302 A1 | 3/2014 | Yoo et al. | |
| 2014/0264548 A1* | 9/2014 | Lee | H01L 27/11582 |
| | | | 257/324 |
| 2015/0206901 A1* | 7/2015 | Lee | H01L 27/11556 |
| | | | 257/314 |
| 2015/0318301 A1* | 11/2015 | Lee | H01L 29/7926 |
| | | | 257/324 |

FOREIGN PATENT DOCUMENTS

| | | |
|---|---|---|
| JP | 2011-211200 | 10/2011 |
| JP | 2012-94694 | 5/2012 |
| JP | 2014-57067 | 3/2014 |

\* cited by examiner

MEMORY CELL ARRAY WITH IMPROVED SUBSTRATE CURRENT PATHWAY

CROSS-REFERENCE TO RELATED APPLICATIONS

This application is based upon and claims the benefit of priority from the prior U.S. Provisional Application 62/218,284, filed on Sep. 14, 2015, the entire contents of which are incorporated herein by reference.

BACKGROUND

Field

Embodiments described herein relate generally to a semiconductor memory device.

Description of the Related Art

A flash memory is known as a kind of semiconductor memory devices. Particularly, a NAND type flash memory is generally used widely due to its low costs and large capacities. In addition, many technologies to further increase the capacities of the NAND type flash memory have been suggested. Among such technologies is a structure in which memory cells are arranged three-dimensionally.

DETAILED DESCRIPTION

A semiconductor memory device according to an embodiment includes a first semiconductor layer containing an acceptor and a memory cell array including an interlayer insulating layer and a conductive layer arranged in a first direction above the first semiconductor layer and a memory columnar body extending in the first direction and having a lower end positioned lower than a position of a top surface of the first semiconductor layer, the memory columnar body containing a second semiconductor layer in a columnar shape having a side face opposite to a side face of the conductive layer, wherein a first portion of the first semiconductor layer in contact with the side face of the memory columnar body contains a donor in a higher concentration than a second portion different from the first portion of the first semiconductor layer.

Hereinafter, semiconductor memory devices according to the embodiments and methods of manufacturing the semiconductor memory devices will be described with reference to the drawings.

The following embodiments relate to a semiconductor memory device having a structure in which a MONOS type (Metal-Oxide-Nitride-Oxide-Semiconductor) transistor including a columnar semiconductor layer arranged in a direction perpendicular to a semiconductor substrate and to be a channel and a conductive layer arranged opposite to the side face of the semiconductor layer via a charge storage layer and to be a gate electrode is used as a memory cell and a plurality of memory cells is arranged in a lamination direction. However, the following embodiments are not limited to such an example and can also be applied to semiconductor memory devices having a structure using, for example, a SONOS type (Semiconductor-Oxide-Nitride-Oxide-Semiconductor) transistor, a MANOS type (Metal-Aluminum Oxide-Nitride-Oxide-Semiconductor) transistor, or a transistor whose insulating layer is formed from hafnium oxide ($HfO_x$), tantalum oxide ($TaO_x$) or the like.

First Embodiment

First, an overall configuration of a semiconductor memory device according to an embodiment will be described.

Figure 1:
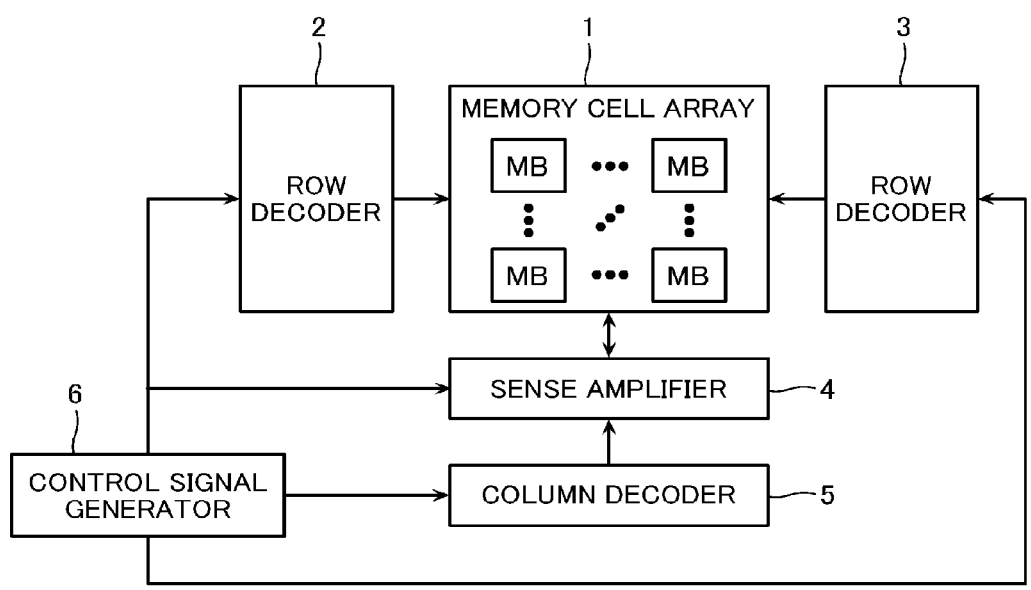
FIG. 1 is a diagram showing function blocks of a semiconductor memory device according to a first embodiment.

FIG. 1 is a diagram showing function blocks of a semiconductor memory device according to the first embodiment.

The semiconductor memory device according to the present embodiment includes a memory cell array 1, row decoders 2, 3, a sense amplifier 4, a column decoder 5, and a control signal generator 6. The memory cell array 1 contains a plurality of memory blocks MB. Each memory block MB contains a plurality of memory cells MC arranged three-dimensionally. The row decoders 2, 3 decode a fetched block address signal and the like to control a write operation and a read operation of data of the memory cell array 1. The sense amplifier 4 detects and amplifies an electric signal flowing to the memory cell array 1 during read operation. The column decoder 5 decodes a column address signal to control the sense amplifier 4. The control signal generator 6 generates, in addition to generating a high voltage used for write operation or erase operation by boosting a reference voltage, a control signal to control the row decoders 2, 3, the sense amplifier 4, and the column decoder 5.

Next, the circuit configuration of the memory cell array 1 will be described.

Figure 2:
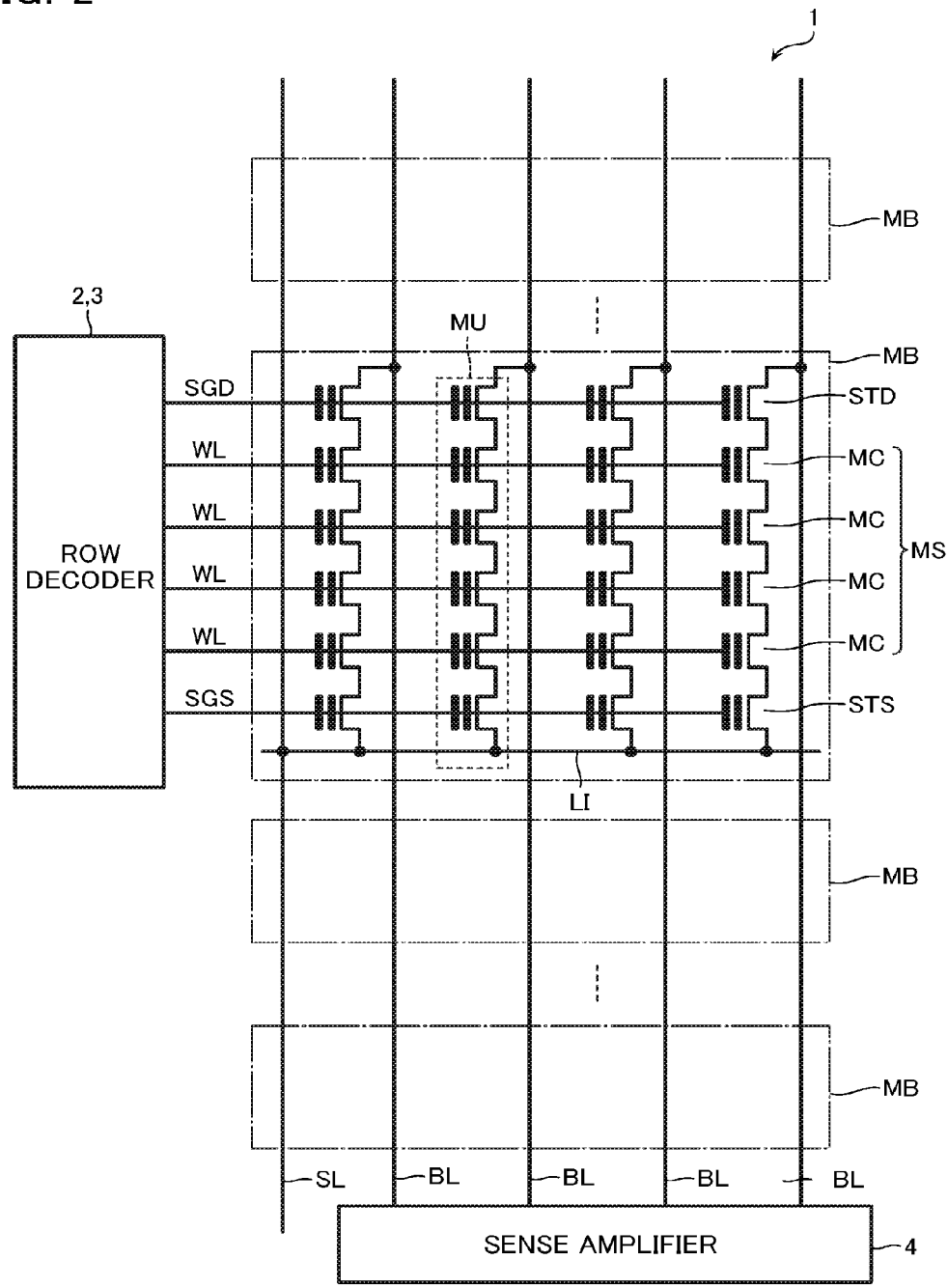
FIG. 2 is an equivalent circuit diagram of a memory cell array of the semiconductor memory device according to the embodiment.

FIG. 2 is an equivalent circuit diagram of a memory cell array of the semiconductor memory device according to the present embodiment.

The memory cell array 1 contains, as shown in FIG. 2, the plurality of memory blocks MB. A plurality of bit lines BL and a source line SL are connected to the plurality of memory blocks MB in common. Each memory block MB is connected to the sense amplifier 4 via the bit line BL and connected to a source line driver (not shown) via the source line SL.

The memory block MB contains a plurality of memory units MU whose one end is connected to the bit line BL and whose other end is connected to the source line SL via a source contact LI. Each memory unit MU contains a memory string MS, a source-side select transistor STS connected to between the memory string MS and the source contact LI, a drain-side select transistor STD connected to between the memory string MS and the bit line BL.

The memory string MS contains the plurality of memory cells MC connected in series. Each memory cell MC is a transistor having a semiconductor layer, a charge storage layer, and a control gate and changes the threshold by storing charges in the charge storage layer in accordance with the voltage applied to the control gate. The respective word lines WL are connected to the control gates of the plurality of memory cells MC belonging to the different memory strings MS. The plurality of memory cells MC is connected to the row decoder 2 or 3 via the word line WL.

The source-side select transistor STS has a control gate to which a source-side select gate line SGS is connected. The source-side select gate line SGS is connected to the row decoder 2 or 3 and is selectively connected to the memory string MS or the semiconductor substrate in accordance with an input signal.

The drain-side select transistor STD has a control gate to which a drain-side select gate line SGD is connected. The drain-side select gate line SGD is connected to the row decoder 2 or 3 and is selectively connected to the memory string MS or the bit line BL in accordance with an input signal.

Next, an outline structure of the memory cell array 1 will be described.

Figure 3:
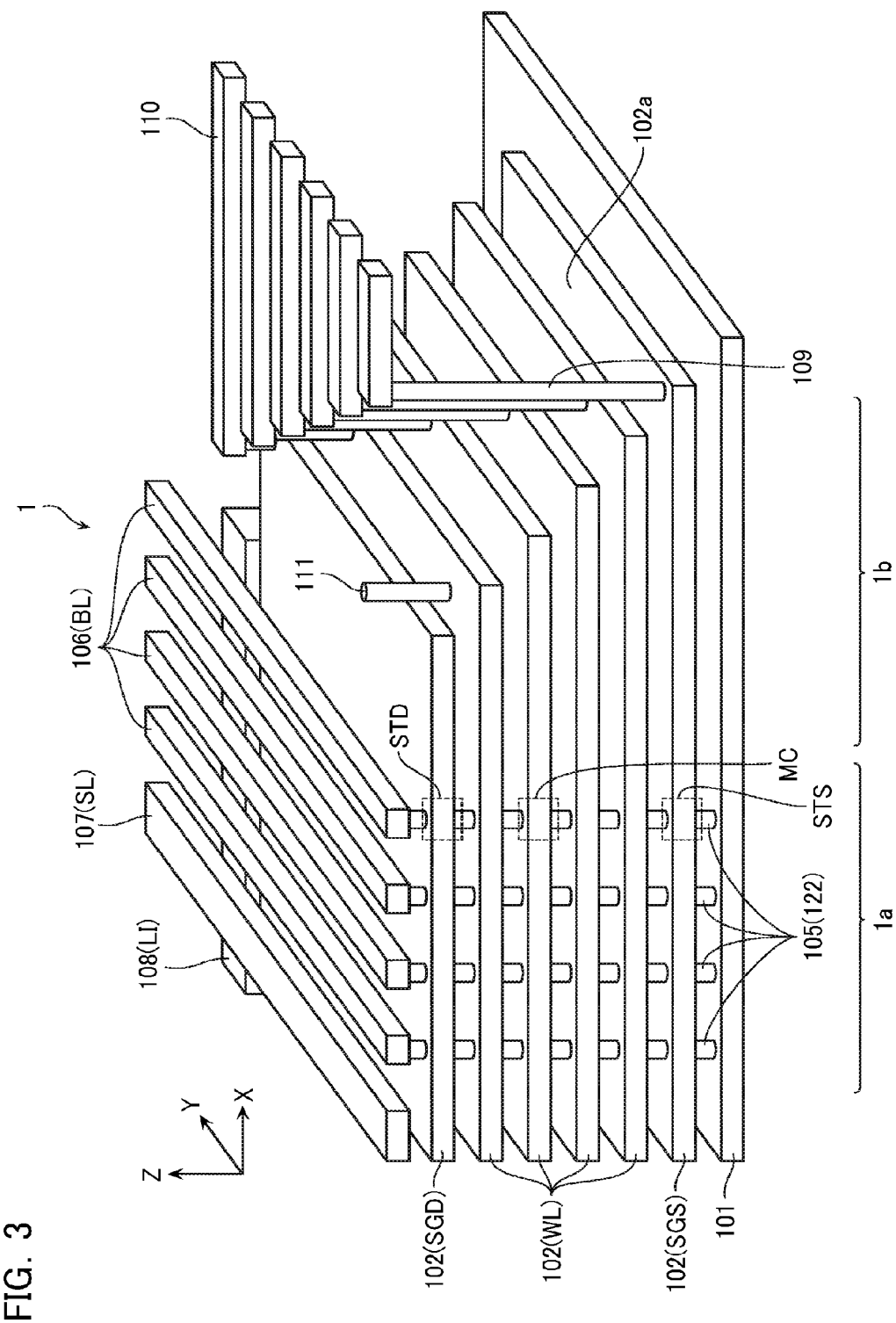
FIG. 3 is a perspective view showing an outline structure of the memory cell array of the semiconductor memory device according to the embodiment.

FIG. 3 is a perspective view showing an outline structure of the memory cell array of the semiconductor memory device according to the present embodiment.

The memory cell array 1 includes, as shown in FIG. 3, a semiconductor substrate 101 (first semiconductor layer) and a plurality of conductive layers 102 arranged in the Z direction above the semiconductor substrate 101. The semiconductor substrate 101 is doped with an acceptor, for example, a boron (B) in the concentration of $1 \times 10^{10}$ to $1 \times 10^{13}$ atm/cm$^3$.

The memory cell array 1 includes a plurality of memory columnar bodies 105 extending in the Z direction. An intersection portion of the conductive layer 102 and the memory columnar body 105 functions as the source-side select transistor STS, the memory cell MC, or the drain-side select transistor STD. The conductive layer 102 is formed from, for example, tungsten (W) or polysilicon (Poly-Si) and functions as the source-side select gate line SGS, the word line WL, or the drain-side select gate line SGD.

The plurality of conductive layers 102 is formed stepwise. That is, the predetermined conductive layer 102 has a contact portion 102a that is not opposed to the undersurface of the other conductive layers 102 positioned in upper layers. The conductive layer 102 is connected to a via 109 through the contact portion 102a. A wire 110 is arranged on a top end of the via 109. The via 109 and the wire 110 are formed from tungsten (W) or the like.

The memory cell array 1 also includes a conductive layer 108 opposed to the side face in the Y direction of the plurality of conductive layers 102 and extending in the X direction. The undersurface of the conductive layer 108 is in contact with the semiconductor substrate 101. The conductive layer 108 is formed from, for example, tungsten (W) and functions as the source contact LI.

The memory cell array 1 also includes a plurality of conductive wires 106 and a conductive wire 107 positioned above the plurality of conductive layers 102 and the plurality of memory columnar bodies 105 and extending in the Y direction by the plurality of wires being arranged in the X direction. The memory columnar bodies 105 are electrically connected to the undersurface of the respective conductive wires 106. The conductive wire 106 is formed from, for example, tungsten (W) and functions as the bit line BL. The conductive layer 108 is electrically connected to the undersurface of the conductive wire 107. The conductive wire 107 is formed from, for example, tungsten (W) and functions as the source line SL.

Further, the memory cell array 1 includes a columnar support 111. The columnar support 111 is communicatively connected to holes formed in the plurality of conductive layers 102 to maintain the posture of the contact portions 102a of the plurality of conductive layers 102.

Hereinafter, an area of the memory cell array 1 where the plurality of memory columnar bodies 105 is arranged may be called a "memory area 1a" and an area where the contact portions 102a of the plurality of conductive layers 102 are formed may be called a "contact area 1b".

Next, an outline structure of the memory cell MC will be described.

Figure 4:
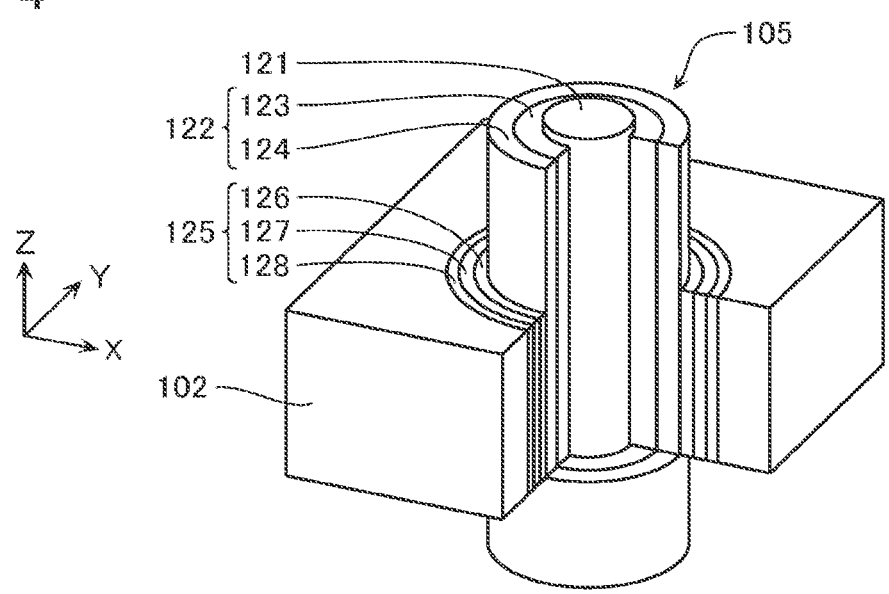
FIG. 4 is a perspective view showing an outline structure of a memory cell of the semiconductor memory device according to the embodiment.

FIG. 4 is a perspective view showing an outline structure of a memory cell of the semiconductor memory device according to the present embodiment. The same structure as that shown in FIG. 4 may be adopted for the source-side select transistor STS and the drain-side select transistor STD.

The memory cell MC is formed in an intersection portion of the conductive layer 102 and the memory columnar body 105. The memory columnar body 105 includes a core insulating layer 121, a semiconductor layer 122 (second semiconductor layer) covering the side face of the core insulating layer 121, and a multi-film layer 125 arranged between the semiconductor layer 122 and the conductive layer 102. The semiconductor layer 122 includes a first conductive film 123 and a second conductive film 124 formed from the core insulating layer 121 to the multi-film layer 125. The multi-film layer 125 includes a tunnel dielectric film 126, a charge storage film 127, and a block dielectric film 128 formed from the semiconductor layer 122 to the conductive layer 102. In the example of FIG. 4, the configuration from the core insulating layer 121 to the block dielectric film 128 is contained in the memory columnar body 105.

The core insulating layer 121 is formed from, for example, silicon oxide ($SiO_2$). The first conductive film 123 and the second conductive film 124 are formed from, for example, polysilicon (Poly-Si) and function as the memory cell MC, the source-side select transistor STS, or the drain-side select transistor STD. The tunnel dielectric film 126 is formed from, for example, silicon oxide ($SiO_2$). The charge storage film 127 is formed from a material capable of storing charges, for example, silicon nitride (SiN). The block dielectric film 128 is formed from, for example, silicon oxide ($SiO_2$).

Next, the structure of the memory cell array 1 will be described.

Figure 5:
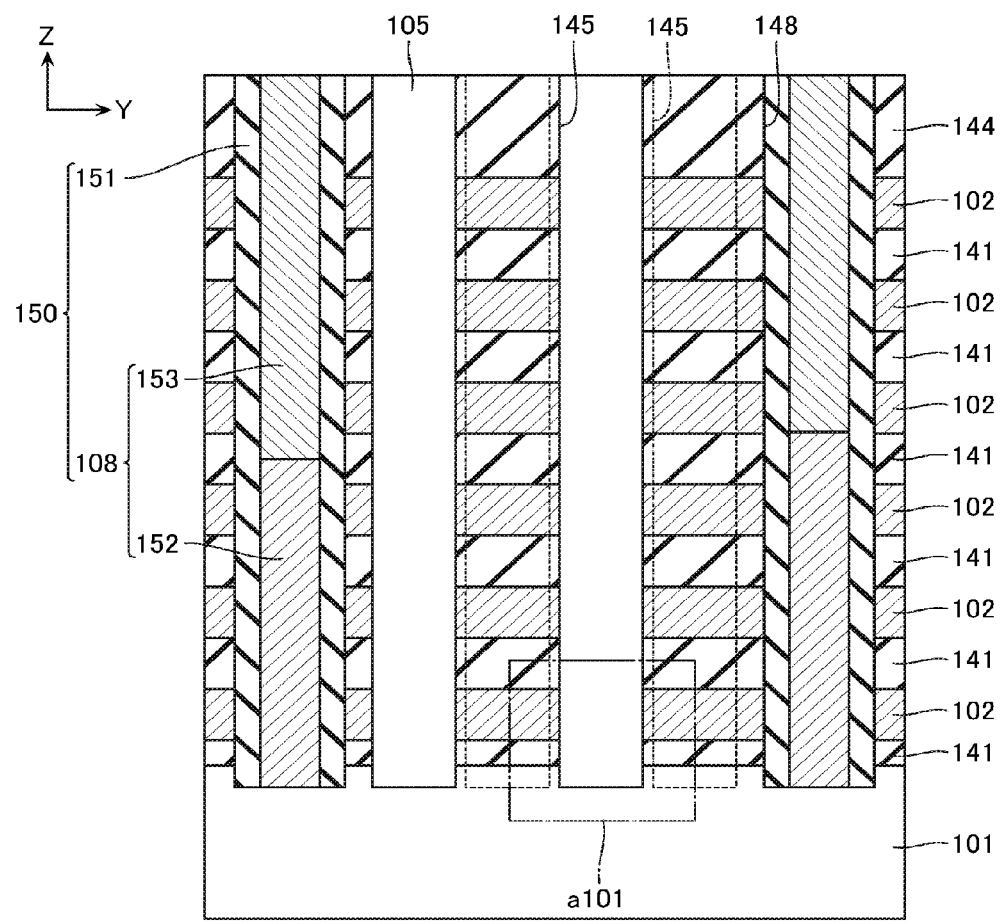
FIG. 5 is a sectional view of the memory cell array of the semiconductor memory device according to the embodiment.

FIG. 5 is a sectional view of the memory cell array of the semiconductor memory device according to the present embodiment. FIG. 5 is a sectional view in the Y-Z direction of the memory area 1a of the memory cell array 1.

The memory cell array 1 includes a plurality of interlayer insulating layers 141 and the plurality of conductive layers 102 arranged alternately above the semiconductor substrate 101 and an interlayer insulating layer 144 arranged above the conductive layer 102. The lowest one of the interlayer insulating layers 141 functions as a gate dielectric film of the source-side select transistor STS.

In the memory area 1a of the memory cell array 1, a plurality of memory holes 145 reaching an upper portion of the semiconductor substrate 101 by cutting through from the interlayer insulating layer 144 to the interlayer insulating layer 141 in the lowest layer in the Z direction is formed and the plurality of memory columnar bodies 105 is embedded in these memory holes 145. The structure of each of the memory columnar bodies 105 is as shown in FIG. 4.

Further, in the memory cell array 1, a plurality of grooves 148 for which the Z direction is a depth direction and the X direction is an extending direction is formed like sandwiching an arrangement area of the memory columnar body 105. A device isolation portion 150 is arranged in the groove 148.

The device isolation portion 150 includes the conductive layer 108 arranged opposite to the inner surface of the groove 148 via an insulating layer 151. The conductive layer 108 is electrically connected to the source line 107 (not shown) arranged above the interlayer insulating layer 144. The conductive layer 108 has a laminated structure two conductive films 152, 153 from the semiconductor substrate 101 to the source line 107. The conductive film 152 is formed from, for example, polysilicon (Poly-Si). The conductive film 153 is formed from, for example, tungsten (W).

Next, the structure around the bottom of the memory columnar body 105 of the memory cell array 1 will be described by referring to two comparative examples. The same reference signs of components in the present embodiment are used for components in the comparative examples that are similar to those in the present embodiment.

Figure 6:
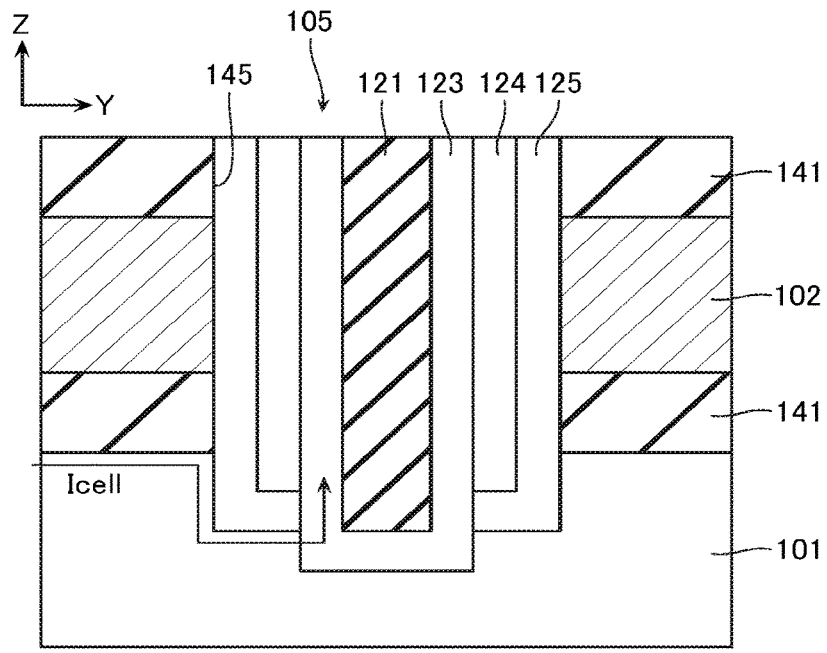
FIG. 6 is a sectional view around the bottom of a memory columnar body of the semiconductor memory device according to Comparative Example 1 of the embodiment.
Figure 7:
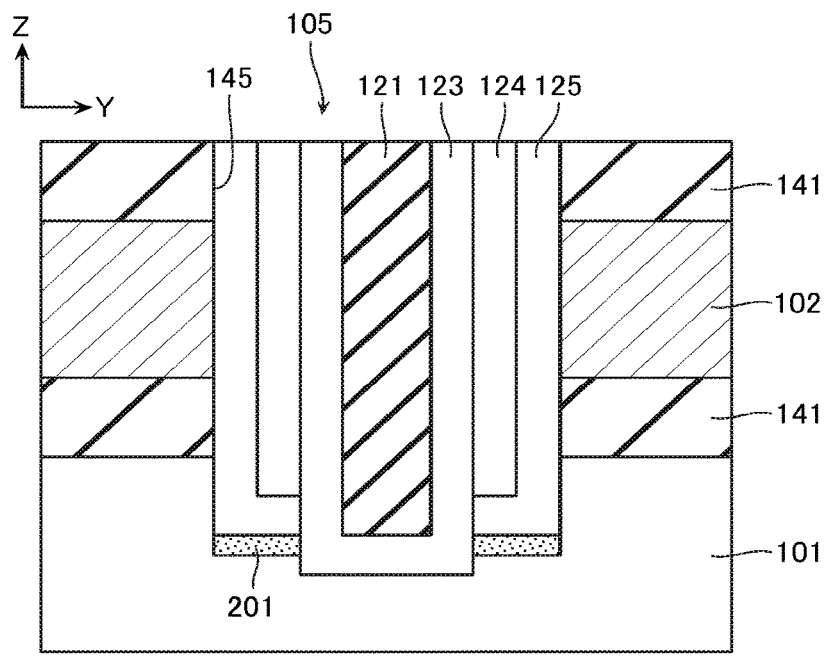
FIG. 7 is a sectional view around the bottom of the memory columnar body of the semiconductor memory device according to Comparative Example 2 of the embodiment.

FIGS. 6 and 7 are sectional views around the bottom of the memory columnar body of the semiconductor memory devices according to Comparative Examples 1, 2. FIGS. 6 and 7 are sectional views in the Y-Z direction enlarging the area a101 surrounded by an alternate long and short dash line in FIG. 5.

In Comparative Example 1, as shown in FIG. 6, the bottom of the memory columnar body 105 is buried deep inside the semiconductor substrate 101. In this case, as indicated by an arrow in FIG. 6, a cell current Icell goes around and the electric resistance increases correspondingly. Thus, it becomes difficult to sweep the cell current Icell.

In Comparative Example 2, as shown in FIG. 7, an impurity portion 201 doped with a donor is arranged to lower the electric resistance of the pathway of the cell current Icell. In this case, a donor mixes into the interlayer insulating layer 141 between the conductive layers 102 during doping, causing a leak current. In addition, there is no intrusion port of holes and thus, holes may not be injectable during erase operation.

Thus, in the present embodiment, a portion around the bottom of the memory columnar body 105 is structured as described below.

Figure 8:
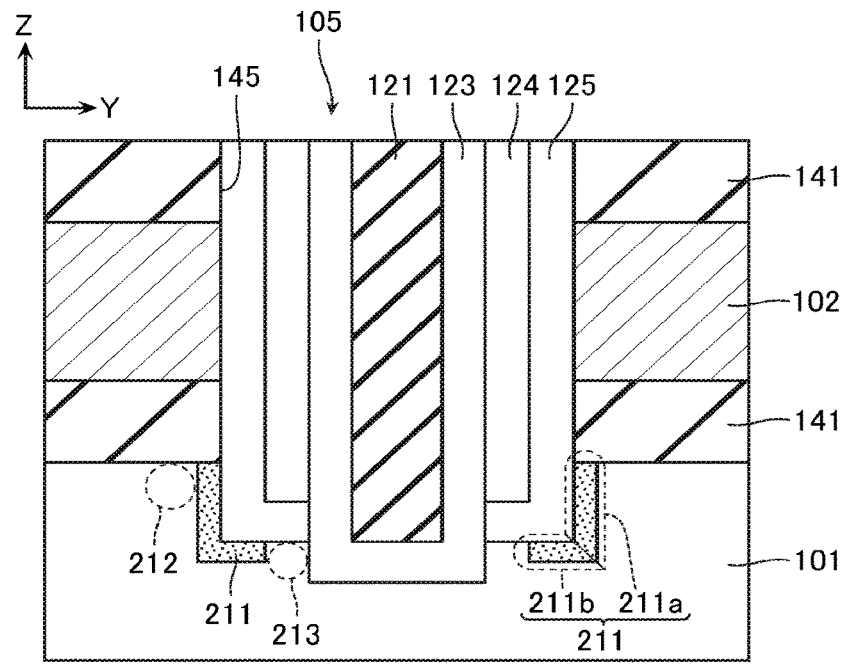
FIG. 8 is a sectional view around the bottom of the memory columnar body of the semiconductor memory device according to the embodiment.

FIG. 8 is a sectional view around the bottom of the memory columnar body of the semiconductor memory device according to the present embodiment. FIG. 8 is a sectional view in the Y-Z direction enlarging the area a101 surrounded by an alternate long and short dash line in FIG. 5.

In the present embodiment, the memory columnar body 105 includes the core insulating layer 121 in a columnar shape extending in the Z direction and also the first conductive film 123, the second conductive film 124, and the multi-film layer 125 arranged from the core insulating layer 121 to the conductive layer 102. The first conductive film 123 is formed like covering the bottom and the side face of the core insulating layer 121. The first conductive film 123 has a bottom exposed to the semiconductor substrate 101 and receives holes from the semiconductor substrate 101. The second conductive film 124 is formed like covering the side face of the first conductive film 123. The multi-film layer 125 is formed like covering the bottom and the side face of the second conductive film 124. The multi-film layer 125 has the end of the bottom in contact with the side face of the first conductive film 123.

Also in the present embodiment, the semiconductor substrate 101 has the impurity portion 211 including an A portion 211a extending in the Z direction in a border with the side face of the multi-film layer 125 and a B portion 211b formed integrally with the A portion 211a and extending in the Y direction in the border with the bottom of the multi-film layer 125 arranged therein. The A portion 211a is in contract with the side face of the multi-film layer 125 of the memory columnar body 105. The B portion 211b is in contact with the bottom of the multi-film layer 125 of the memory columnar body, but is not in contact with the side face of the first conductive film 123.

The impurity portion 211 is doped with a donor, for example, phosphorus (P) or arsenic (As) in the concentration of, for example, $1 \times 10^{14}$ to $1 \times 10^{17}$ atm/cm$^3$. This concentration of donor is higher than that of other portions in the semiconductor substrate 101, for example, a portion 212 in a border with the bottom of the interlayer insulating layer 141 in the lowest layer and not in contact with the multi-film layer 125 (in other words, positioned on the top surface of the semiconductor substrate 101 and arranged farther than the impurity portion 211 from the side face of the memory columnar body 105) and a portion 213 in a border with the bottom of the multi-film layer 125 and in a border with the side face of the first conductive film 123. This concentration is also higher than that of an acceptor of the semiconductor substrate 101.

Next, manufacturing processes of the memory cell array 1 according to the present embodiment will be described. Here, forming processes around the bottom of the memory columnar body 105 will be described.

FIGS. 9 to 17 are sectional views illustrating manufacturing processes of the memory cell array of the semiconductor memory device according to the present embodiment. FIGS. 9 to 17 are sectional views in the Y-Z direction around the bottom of the memory columnar body 105.

Figure 9:
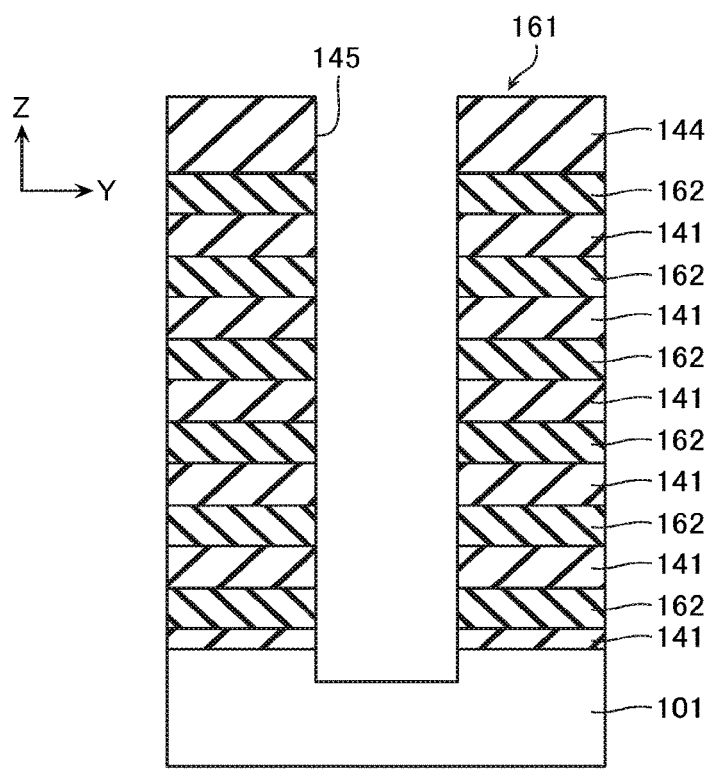
FIGS. 9 to 17 are sectional views illustrating manufacturing processes of the memory cell array of the semiconductor memory device according to the embodiment.

FIG. 9 shows a process after a laminated body 161 is formed on the semiconductor substrate 101. The laminated body 161 includes the plurality of interlayer insulating layers 141 and a plurality of sacrificial layers 162 arranged alternately in the Z direction and the interlayer insulating layer 144 arranged in the Z direction above the top-layer sacrificial layer 162. The sacrificial layer 162 is a layer to be replaced by the conductive layer 102 in a subsequent process and is formed from, for example, silicon nitride ($Si_3N_4$).

In FIG. 9, the memory hole 145 extending in the Z direction to the laminated body 161 and whose bottom reaches the top surface of the semiconductor substrate 101 is formed by, for example, RIE. In this case, the bottom of the memory hole 145 is buried up to a position lower than the top surface of the semiconductor substrate 101 by over-etching of RIE.

Figure 10:
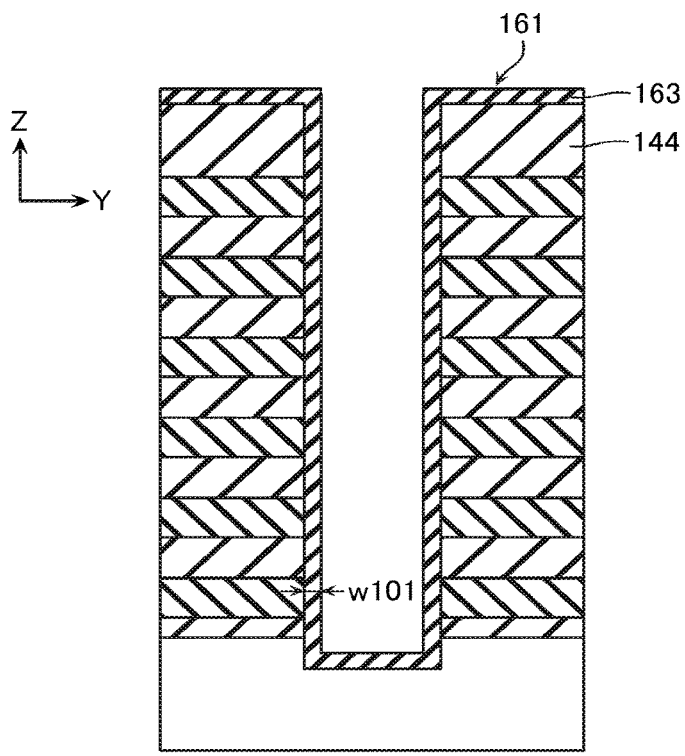

In FIG. 10, an oxide film 163 is formed on the top surface of the interlayer insulating layer 144 and on the bottom and side face of the memory hole 145. The oxide film 163 is formed from, for example, silicon oxide ($SiO_2$) and contains a donor such as phosphorus (P), arsenic (As) and the like.

Figure 11:
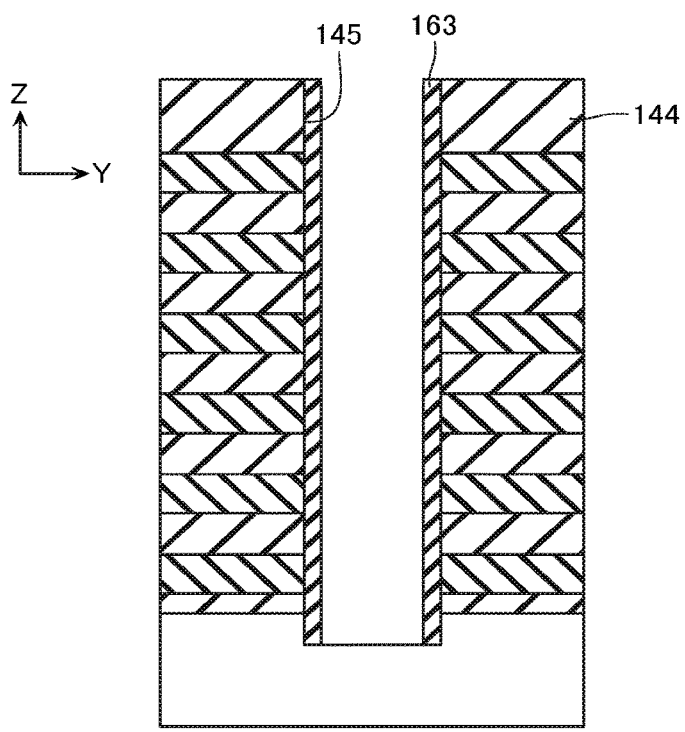

In FIG. 11, the oxide film 163 on the top surface of the interlayer insulating layer 144 and on the bottom of the memory hole 145 by, for example, RIE is removed.

Figure 12:
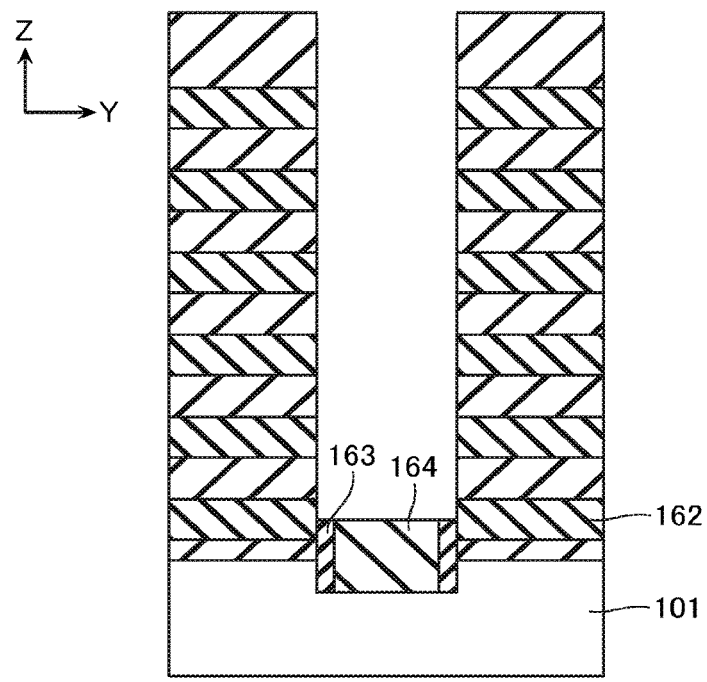

In FIG. 12, a resist 164 to protect the semiconductor substrate 101 appearing at the bottom of the memory hole 145 is embedded in the memory hole 145. Then, the resist 164 is removed until the top surface of the resist 164 is equal to or lower than the top surface of the bottom-layer sacrificial layer 162 in the Z direction and also equal to or higher than the top surface of the semiconductor substrate 101 by, for example, oxygen system ashing. Then, the oxide film 163 exposed in a position equal to or higher than the top surface of the resist 164 in the Z direction is removed by fluoridization in which the etching speed increases with an increasing donor concentration.

Figure 13:
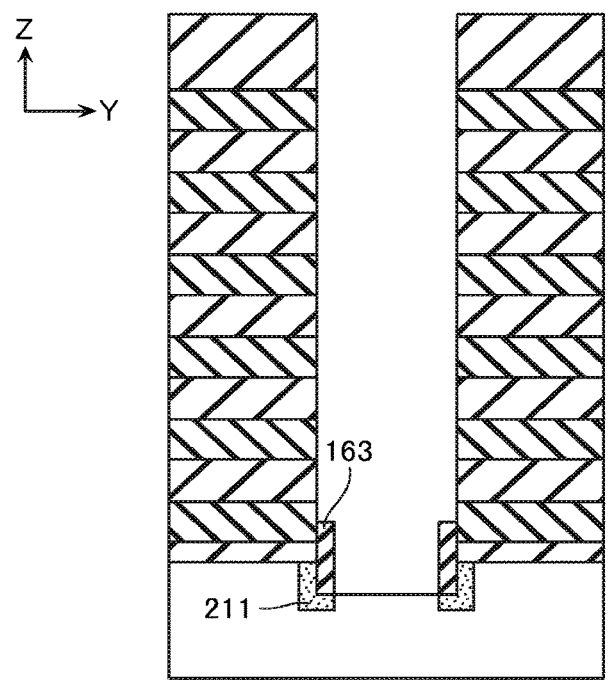

In FIG. 13, the resist 164 is removed. Then, the oxide film 163 is annealed, for example, at 1000° C. for 10 s. Accordingly, the donor is diffused from the oxide film 163 into the semiconductor substrate 101. As a result, the impurity portion 211 shown in FIG. 8 is formed. The oxide film 163 is removed up to the top surface of the bottom-layer sacrificial layer 162 or lower by the process in FIG. 13 and therefore, no donor is introduced into the sacrificial layer 141 between the conductive layers 102. As a result, no leak current between the conductive layers 102 resulting from the process is generated.

Figure 14:
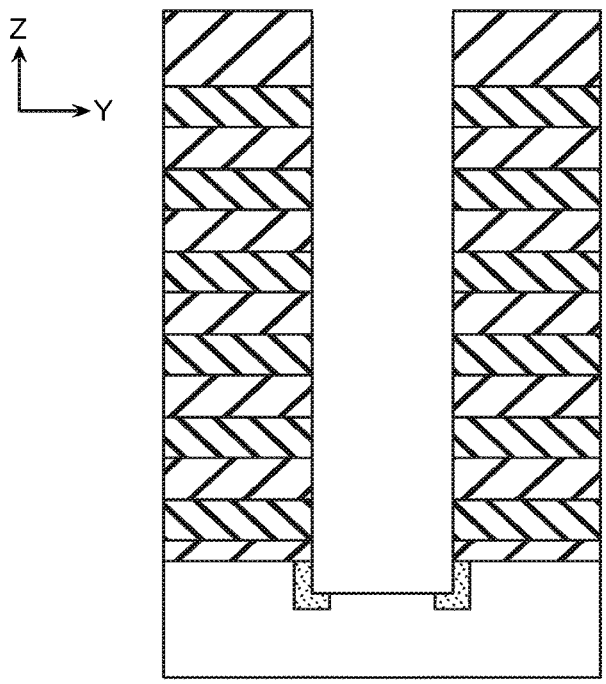

In FIG. 14, the remaining oxide film 163 is removed by fluoridization similar to the fluoridization in the process of FIG. 12.

Figure 15:
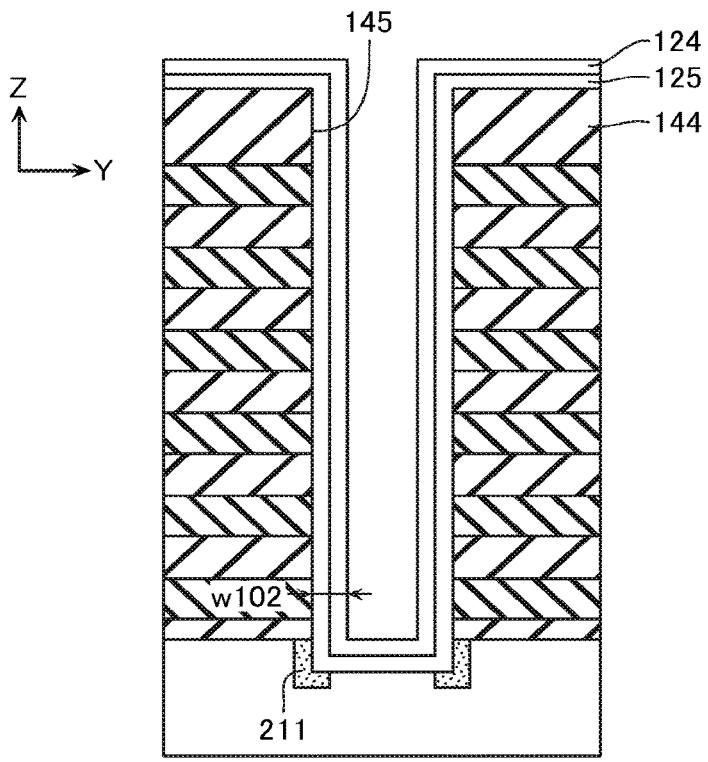

In FIG. 15, the multi-film layer 125 and the second conductive film 124 are formed on the top surface of the interlayer insulating layer 144 and on the bottom and side face of the memory hole 145. Here, the second conductive film 124 and the multi-film layer 125 are formed such that a width w102 in the Y direction combining the second conductive film 124 and the multi-film layer 125 is wider than a width w101 (see FIG. 10) in the Y direction of the oxide film 163. Accordingly, the impurity portion 211 can be separated from the side face of the first conductive film 123 formed in a subsequent process.

Figure 16:
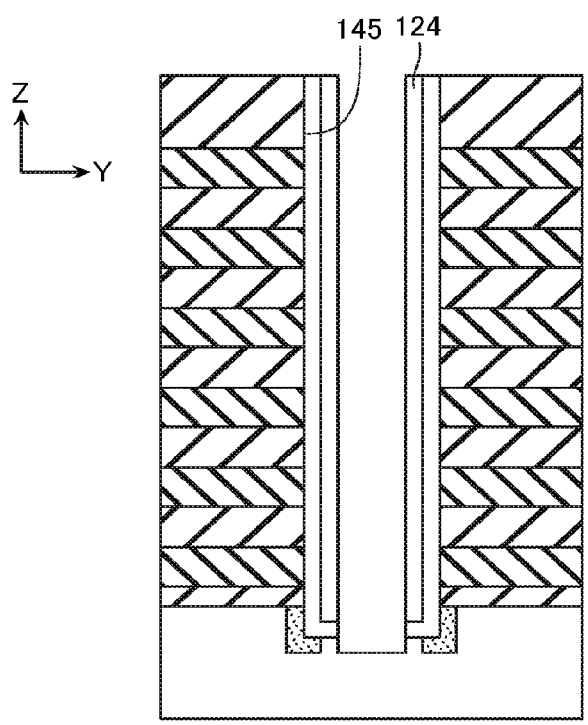

In FIG. 16, the bottoms of the second conductive film 124 and the multi-film layer 125 are removed by, for example, RIE. Accordingly, an inner portion of the memory hole 145 from the second conductive film 124 when viewed from the Z direction is dug further deeper into the semiconductor substrate 101. The second conductive film 124 is formed from, for example, polysilicon (Poly-Si). The multi-film layer 125 is formed from, for example, a tunnel dielectric film 126 made of silicon oxide ($SiO_2$), the charge storage film 127 made of silicon nitride ($Si_3N_4$), and the block dielectric film 128 made of silicon oxide ($SiO_2$).

Figure 17:
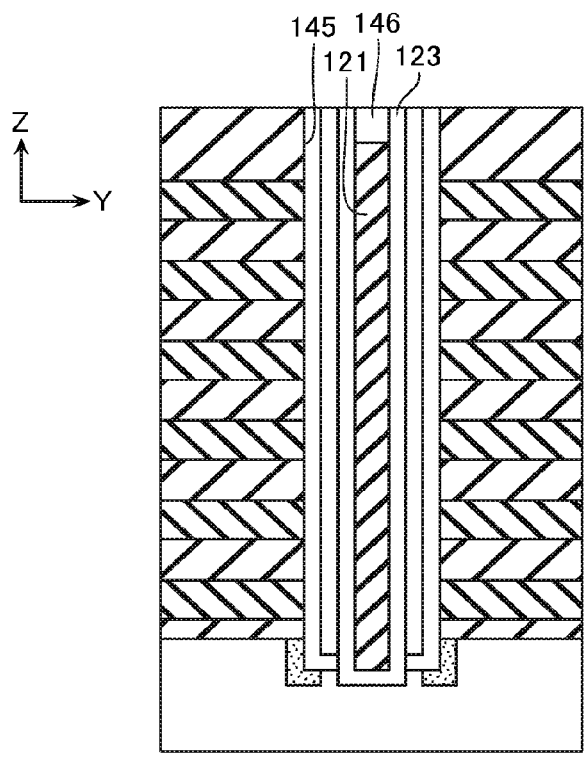

In FIG. 17, the first conductive film 123 and the core insulating layer 121 are formed on the side face of the second conductive film 124 inside the memory hole 145. Then, a cap semiconductor layer 146 is formed on the core insulating layer 121. The core insulating layer 121 is formed from, for example, silicon oxide ($SiO_2$). The first conductive film 123 and the cap semiconductor layer 146 are formed from, for example, polysilicon (Poly-Si).

The above are forming processes around the bottom of the memory columnar body 105 of the memory cell array 1.

According to the present embodiment, in contrast to Comparative Example 1, the impurity portion 211 is arranged in a border with the side face of the multi-film layer 125 and in a border with the bottom thereof to be a pathway of the cell current Icell of the semiconductor substrate 101 and thus, the electric resistance of this portion can be reduced. On the other hand, the impurity portion 211 is not arranged in a border between the semiconductor substrate 101 and the first conductive film 123 and thus, hole injection is not inhibited like the impurity portion 201 in Comparative Example 2.

That is, according to the present embodiment, a semiconductor memory device realizing the reduction of parasitic channel resistance of the semiconductor substrate and high efficiency of hole injection and a method of manufacturing the semiconductor memory device can be provided.

Second Embodiment

The second embodiment is a modification of the first embodiment. Here, mainly differences from the first embodiment will be described.

Figure 18:
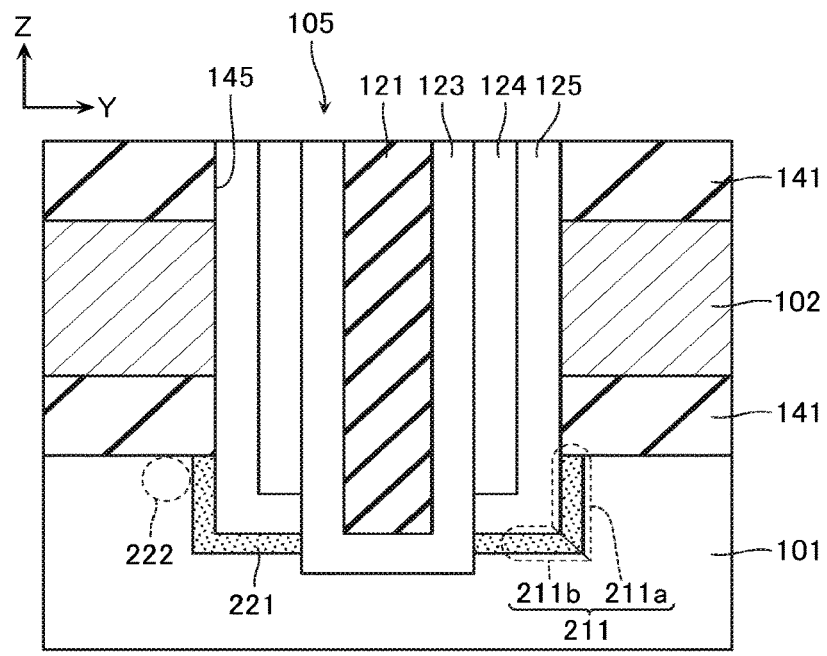
FIG. 18 is a sectional view around the bottom of the memory columnar body of the semiconductor memory device according to a second embodiment.

FIG. 18 is a sectional view around the bottom of the memory columnar body of the semiconductor memory device according to the second embodiment. FIG. 18 is a sectional view in the Y-Z direction.

Like the memory cell array 1 according to the first embodiment, the memory cell array 1 according to the present embodiment has an impurity portion 221 in which the semiconductor substrate 101 is doped with a donor arranged therein. Like the impurity portion 211 according to the first embodiment, the impurity portion 221 includes an A portion 221a extending in the Z direction in a border with the side face of the multi-film layer 125 and a B portion 221b formed integrally with the A portion 221a and extending in the Y direction in the border with the bottom of the multi-film layer 125. However, the B portion 221b of the impurity portion 221 is in contact with the entire bottom of the multi-film layer 125 and also in contact with the side face of the first conductive film 123. That is, in the second embodiment, the impurity portion 221 and the first conductive film 123 are not separated like in the first embodiment.

Next, manufacturing processes of the memory cell array 1 according to the present embodiment will be described. Here, forming processes around the bottom of the memory columnar body 105 will mainly be described. The processes as shown in FIGS. 9 and 10 are also performed in the second embodiment and thus, processes after FIG. 10 will be described here.

FIGS. 19 to 24 are sectional views illustrating manufacturing processes of a memory cell array of the semiconductor memory device according to the present embodiment. FIGS. 19 to 24 are sectional views in the Y-Z direction around the bottom of the memory columnar body 105.

Figure 19:
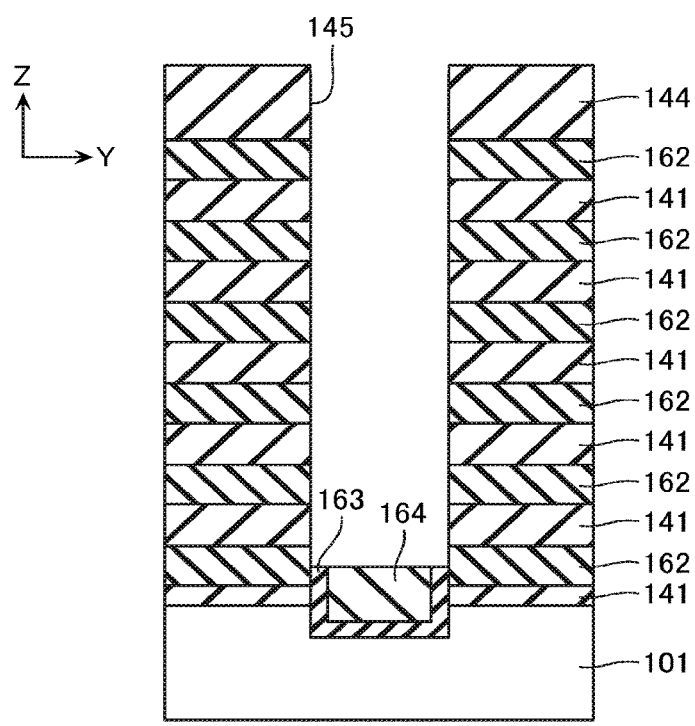
FIGS. 19 to 24 are sectional views illustrating manufacturing processes of the memory cell array of the semiconductor memory device according to the embodiment.

In FIG. 19, the resist 164 to annul the semiconductor substrate 101 appearing at the bottom of the memory hole 145 is embedded in the memory hole 145. Then, the resist 164 is removed until the top surface of the resist 164 is equal to or lower than the top surface of the bottom-layer sacrificial layer 162 in the Z direction and also equal to or higher than the top surface of the semiconductor substrate 101 by, for example, oxygen system ashing. Then, the oxide film 163 exposed in a position equal to or higher than the top surface of the resist 164 in the Z direction is removed by fluoridization in which the etching speed increases with an increasing donor concentration. In the case of the present embodiment, the process to remove the bottom of the oxide film 163 is omitted and thus, in contrast to the first embodiment, the oxide film 163 remains on the bottom of the memory hole 145.

Figure 20:
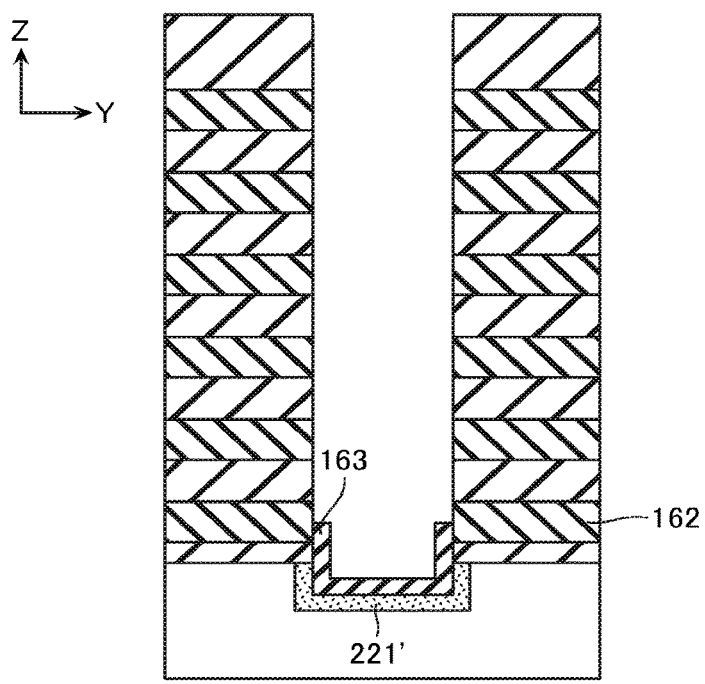

In FIG. 20, the resist 164 is removed. Then, the oxide film 163 is annealed, for example, at 1000° C. for 10 s. Accordingly, the donor is diffused from the oxide film 163 into the semiconductor substrate 101. As a result, an impurity portion 221' to be the impurity portion 221 in a subsequent process is formed. In the process, the impurity portion 221' is formed in a shallow position of the semiconductor substrate 101 by controlling the donor concentration of the oxide film 163 and conditions of annealing. Accordingly, a current does not go around below the lower end of the first conductive film 123 and thus, hole injection into the semiconductor layer 122 is less likely to be inhibited. Also, the oxide film 163 is removed up to the top surface of the bottom-layer sacrificial layer 162 or lower by the process in FIG. 13 and therefore, no donor is introduced into the sacrificial layer 141 between the conductive layers 102. As a result, no leak current between the conductive layers 102 resulting from the process is generated.

Figure 21:
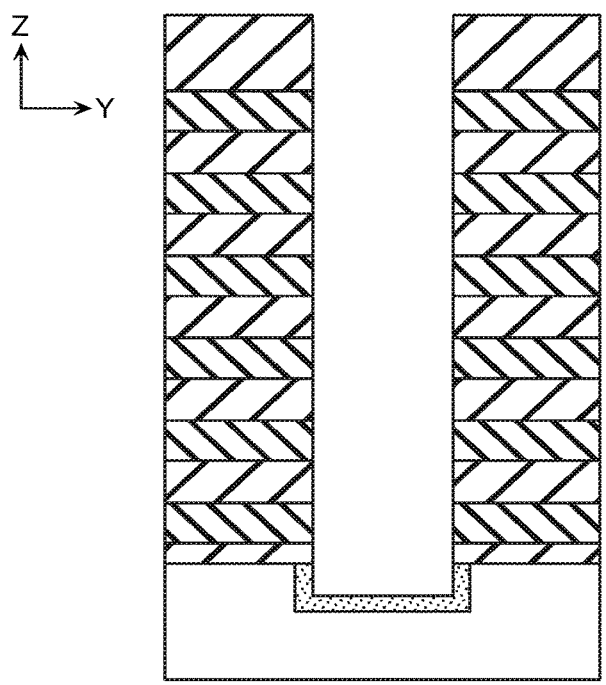

In FIG. 21, the remaining oxide film 163 is removed by fluoridization similar to the fluoridization in the process of FIG. 19.

Figure 22:
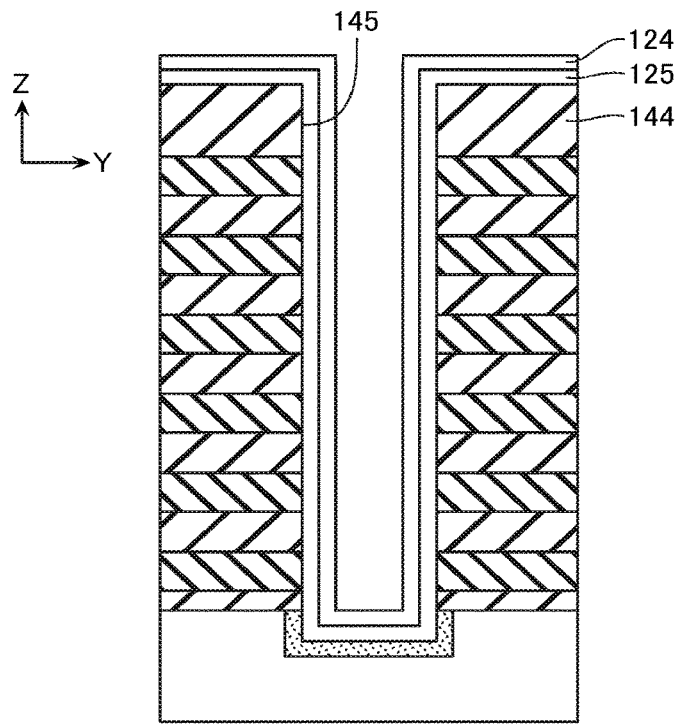

In FIG. 22, the multi-film layer 125 and the second conductive film 124 are formed on the top surface of the interlayer insulating layer 144 and on the bottom and side face of the memory hole 145.

Figure 23:
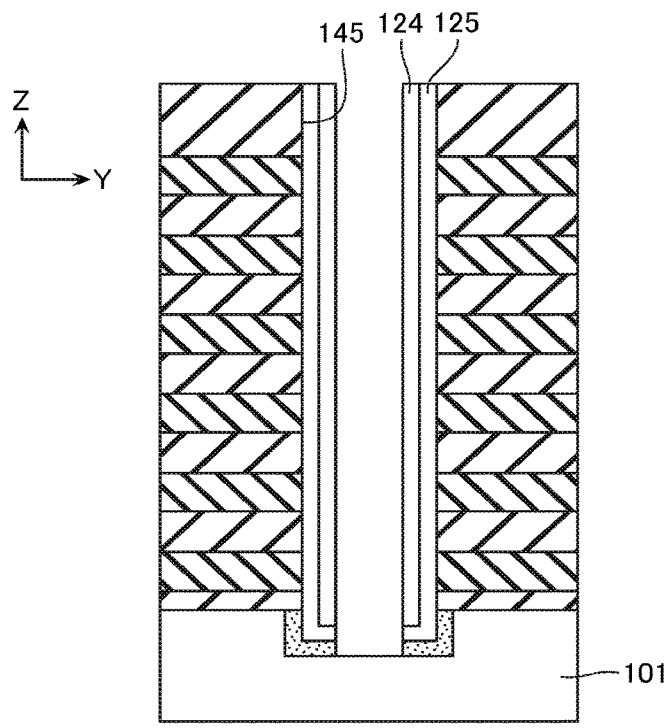

In FIG. 23, the bottoms of the second conductive film 124 and the multi-film layer 125 are removed by, for example, RIE. Accordingly, an inner portion of the memory hole 145 from the second conductive film 124 when viewed from the Z direction is dug further deeper into the semiconductor substrate 101.

Figure 24:
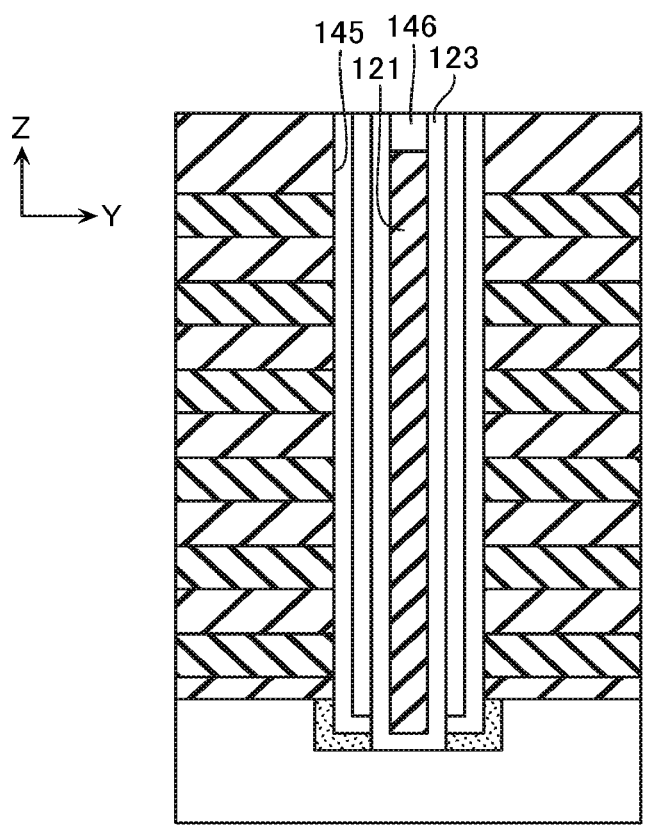

In FIG. 24, the first conductive film 123 and the core insulating layer 121 are formed on the inner side of the second conductive film 124 inside the memory hole 145. Then, the cap semiconductor layer 146 is formed on the core insulating layer 121.

The above are forming processes around the bottom of the memory columnar body 105 of the memory cell array 1.

According to the present embodiment, an impurity portion containing a donor is arranged in a border between the semiconductor substrate and the first semiconductor layer and thus, compared with the first embodiment and Comparative Example 1, the efficiency of hole injection is slightly impaired. However, compared with Comparative Examples 1, 2, the parasitic channel resistance of the pathway of a cell current is reduced and thus, a large cell current can be obtained. Also in the present embodiment, there is no need to remove the bottom of the oxide film containing a donor in the manufacturing process of the memory cell array 1 and therefore, compared with the first embodiment, the manufacturing processes of the memory cell array 1 can be simplified.

[Others]

In the foregoing, some embodiments of the present invention have been described, but these embodiments are presented by way of example and do not intend to limit the scope of the invention. These novel embodiments can be carried out in various other ways and various omissions, substitutions, and alterations can be made without deviating from the spirit of the invention. These embodiments and modifications thereof are included in the scope and spirit of the invention and are also included in the invention described in claims and equivalents thereof.

For example, the memory cell array 1 may be, in addition to the structure shown in FIG. 3, for example, the following structure may be adopted.

Figure 25:
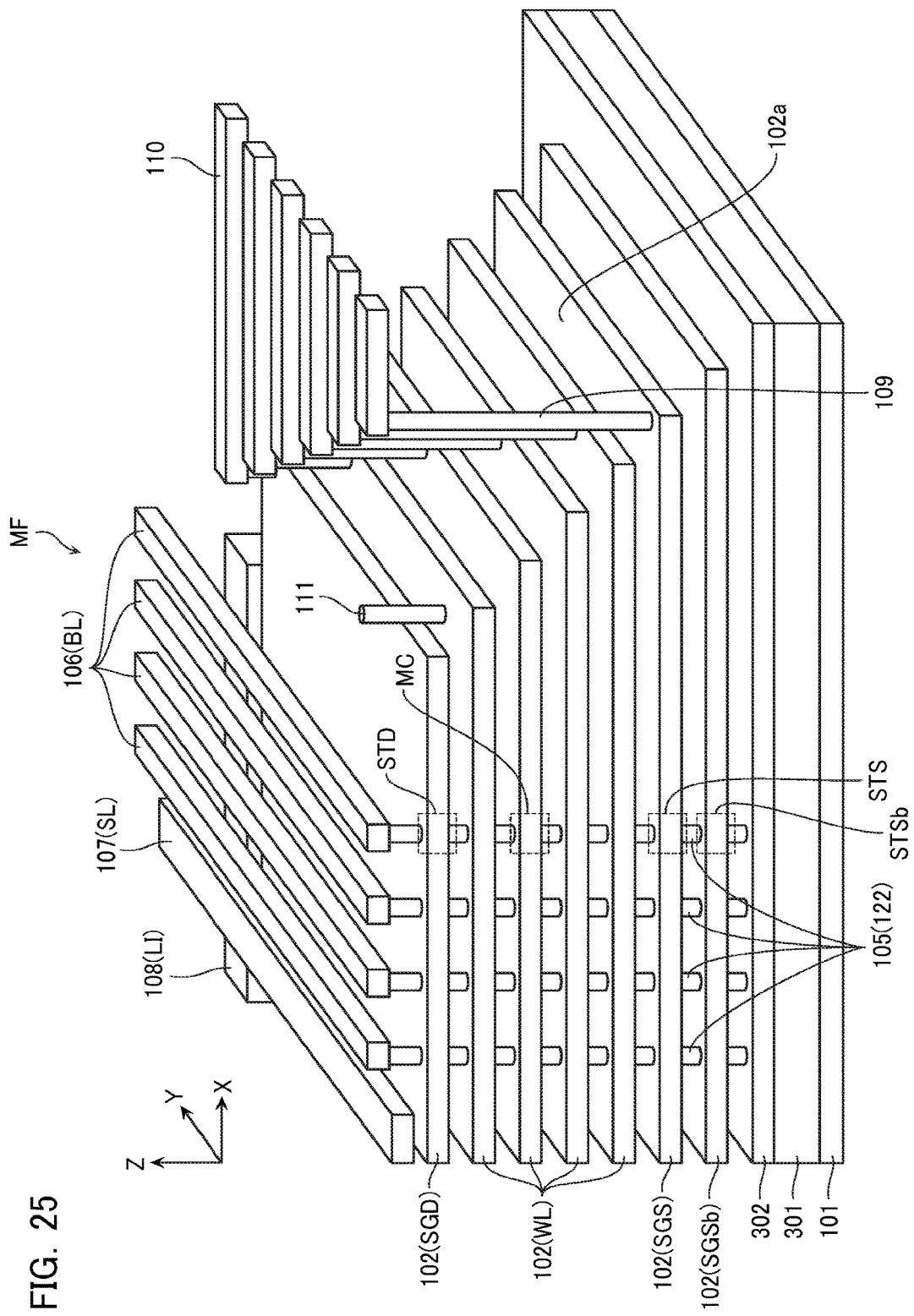
FIG. 25 is a perspective view showing an outline structure of the memory cell array of the semiconductor memory device according to another embodiment.

FIG. 25 is a perspective view showing an outline structure of the memory cell array of the semiconductor memory device according to another embodiment.

As shown in FIG. 25, in the memory cell array 1, a circuit layer 301 and a semiconductor layer 302 may be arranged between the semiconductor layer 101 and the lowest-layer conductive layer 102. The circuit layer 301 contains, for example, FET (field effect transistor) and wires. The semiconductor layer 302 is formed from, for example, polysilicon (Poly-Si). The semiconductor layer 302 may also be connected to the lower end of the memory columnar body 105 and the conductive layer 108 functioning as the source contact LI. Further, in addition to the structure shown in FIG. 18, instead of the semiconductor substrate 101, a semiconductor layer formed from silicon (Si) or like or an interlayer insulating layer formed from silicon oxide ($SiO_2$) or like may be arranged from the memory cell array 1.

What is claimed is:

1. A semiconductor memory device comprising:
   a first semiconductor layer containing an acceptor; and
   a memory cell array including an interlayer insulating layer and a conductive layer arranged in a first direction above the first semiconductor layer and a memory columnar body extending in the first direction and having a lower end positioned lower than a position of a top surface of the first semiconductor layer, the memory columnar body containing a second semiconductor layer in a columnar shape having a side face opposite to a side face of the conductive layer,
   a first portion of the first semiconductor layer in contact with the side face of the memory columnar body containing a donor in a higher concentration than a second portion different from the first portion of the first semiconductor layer, and
   the second portion of the first semiconductor layer being on a top surface of the first semiconductor layer and being arranged farther than the first portion from the side face of the memory columnar body.

2. The semiconductor memory device according to claim 1, wherein
   a concentration of the donor of the first portion of the first semiconductor layer is higher than the concentration of the acceptor of the first semiconductor layer.

3. The semiconductor memory device according to claim 1, wherein
   the donor is phosphorus (P) or arsenic (As), and
   the acceptor is boron (B).

4. The semiconductor memory device according to claim 1, wherein
   a concentration of the donor of the first portion of the first semiconductor layer is $1 \times 10^{14}$ to $1 \times 10^{17}$ atm/$cm^3$.

5. The semiconductor memory device according to claim 1, wherein
   a concentration of the acceptor of the first semiconductor layer is $1 \times 10^{10}$ to $1 \times 10^{13}$ atm/$cm^3$.

6. A semiconductor memory device comprising:
   a first semiconductor layer containing an acceptor; and
   a memory cell array including an interlayer insulating layer and a conductive layer arranged in a first direction above the first semiconductor layer and a memory columnar body extending in the first direction and having a lower end positioned lower than a position of a top surface of the first semiconductor layer, the memory columnar body containing a second semiconductor layer in a columnar shape having a side face opposite to a side face of the conductive layer, a first portion of the first semiconductor layer in contact with a bottom and the side face of the memory columnar body containing a donor in a higher concentration than a second portion different from the first portion of the first semiconductor layer, and the second portion of the first semiconductor layer being on a top surface of the first semiconductor layer and being arranged farther than the first portion from the side face of the memory columnar body.

7. The semiconductor memory device according to claim 6, wherein
a concentration of the donor of the first portion of the first semiconductor layer is higher than the concentration of the acceptor of the first semiconductor layer.

8. The semiconductor memory device according to claim 6, wherein
the donor is phosphorus (P) or arsenic (As), and
the acceptor is boron (B).

9. The semiconductor memory device according to claim 6, wherein
a concentration of the donor of the first portion of the first semiconductor layer is $1 \times 10^{14}$ to $1 \times 10^{17}$ atm/cm$^3$.

10. The semiconductor memory device according to claim 6, wherein
a concentration of the acceptor of the first semiconductor layer is $1 \times 10^{10}$ to $1 \times 10^{13}$ atm/cm$^3$.

11. The semiconductor memory device according to claim 6, wherein
the second semiconductor layer of the memory columnar body has a side face in contact with the first semiconductor layer, and
the first portion of the first semiconductor layer contains the donor in the higher concentration than a third portion different from the first portion and the second portion and in contact with the side face of the second semiconductor layer of the memory columnar body.

12. The semiconductor memory device according to claim 6, wherein
the second semiconductor layer of the memory columnar body includes a first semiconductor film having a side face in contact with the first semiconductor layer and a second semiconductor film arranged between the conductive layer and the first semiconductor film.

13. The semiconductor memory device according to claim 11, wherein
the third portion of the first semiconductor layer is arranged in an arrangement area of the second semiconductor layer when viewed from the first direction.

14. A semiconductor memory device comprising:
a first semiconductor layer containing an acceptor; and
a memory cell array including an interlayer insulating layer and a conductive layer arranged in a first direction above the first semiconductor layer and a memory columnar body extending in the first direction and having a lower end positioned lower than a position of a top surface of the first semiconductor layer, the memory columnar body containing a second semiconductor layer in a columnar shape having a side face opposite to a side face of the conductive layer, a first portion of the first semiconductor layer in contact with a bottom and the side face of the memory columnar body containing a donor in a higher concentration than a second portion different from the first portion of the first semiconductor layer, the second semiconductor layer of the memory columnar body having a side face in contact with the first semiconductor layer, and the first portion of the first semiconductor layer containing the donor in the higher concentration than a third portion different from the first portion and the second portion and in contact with the side face of the second semiconductor layer of the memory columnar body.

15. The semiconductor memory device according to claim 14, wherein
a concentration of the donor of the first portion of the first semiconductor layer is higher than the concentration of the acceptor of the first semiconductor layer.

16. The semiconductor memory device according to claim 14, wherein
the donor is phosphorus (P) or arsenic (As), and
the acceptor is boron (B).

17. The semiconductor memory device according to claim 14, wherein
a concentration of the donor of the first portion of the first semiconductor layer is $1 \times 10^{14}$ to $1 \times 10^{17}$ atm/cm$^3$.

18. The semiconductor memory device according to claim 14, wherein
a concentration of the acceptor of the first semiconductor layer is $1 \times 10^{10}$ to $1 \times 10^{13}$ atm/cm$^3$.

19. The semiconductor memory device according to claim 14, wherein
the second semiconductor layer of the memory columnar body includes a first semiconductor film having a side face in contact with the first semiconductor layer and a second semiconductor film arranged between the conductive layer and the first semiconductor film.

20. The semiconductor memory device according to claim 14, wherein
the third portion of the first semiconductor layer is arranged in an arrangement area of the second semiconductor layer when viewed from the first direction.

* * * * *